United States Patent
Kuo et al.

(10) Patent No.: US 6,768,366 B2
(45) Date of Patent: Jul. 27, 2004

(54) CHARGE PUMP SYSTEM AND CLOCK GENERATOR

(75) Inventors: Nai-Pin Kuo, Hsinchu (TW); Se-Chueh Lo, Hsinchu (TW); Wen-Yi Hsieh, Hsinchu (TW); Yufe Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/462,861

(22) Filed: Jun. 17, 2003

(65) Prior Publication Data

US 2004/0000941 A1 Jan. 1, 2004

Related U.S. Application Data

(60) Provisional application No. 60/395,534, filed on Jul. 12, 2002, and provisional application No. 60/392,387, filed on Jun. 29, 2002.

(51) Int. Cl.[7] .................................................. G06F 1/04
(52) U.S. Cl. ...................................... 327/291; 327/293
(58) Field of Search ................................. 327/291, 293, 327/295, 257, 256, 258, 259, 512, 513, 536, 537, 534

(56) References Cited

U.S. PATENT DOCUMENTS

| 5,394,372 A | 2/1995 | Tanaka et al. ............... 327/536 |
| 6,064,275 A | 5/2000 | Yamauchi ..................... 327/534 |
| 6,407,596 B1 * | 6/2002 | Taft et al. .................... 327/116 |
| 6,573,798 B2 * | 6/2003 | Uto .............................. 331/16 |

* cited by examiner

Primary Examiner—Linh M. Nguyen
(74) Attorney, Agent, or Firm—Stout, Uxa, Buyan & Mullins, LLP

(57) ABSTRACT

A current produced by a current mirror in a clock generator circuit for a charge pump is controlled by a temperature dependent, current-adjusting MOSFET which has a threshold voltage (Vt) that varies with temperature. As the temperature varies, the current through the a temperature dependent, current-adjusting MOSFET varies, to thereby control a frequency of the clock generator circuit. The MOSFET can be provided with a temperature-independent power supply, so that the current of the temperature dependent, current-adjusting MOSFET can be more closely controlled.

15 Claims, 12 Drawing Sheets

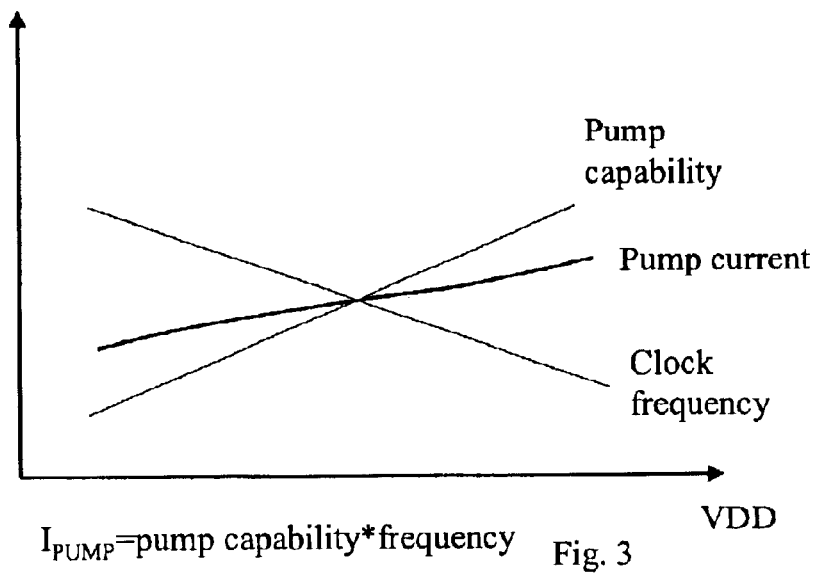
$I_{PUMP}$=pump capability*frequency   Fig. 3
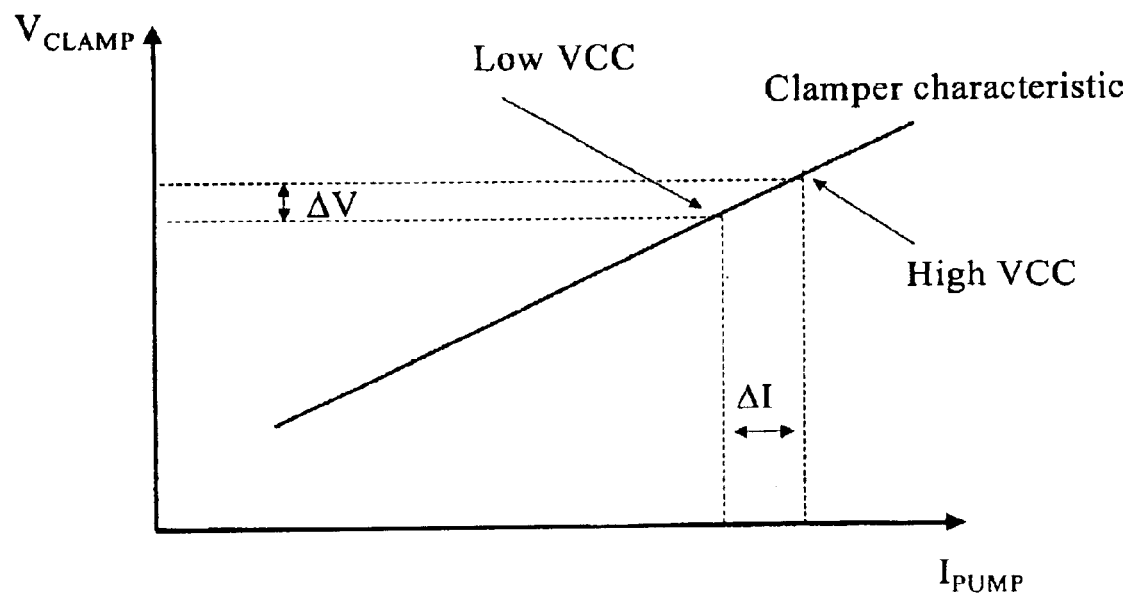
$V_{CLAMP}$ stability improved   Fig. 4

$I_{PUMP}$=pump capability*frequency

CHARGE PUMP SYSTEM AND CLOCK GENERATOR

CROSS-REFERENCE TO RELATED APPLICATIONS

This application claims the benefit of U.S. Provisional Application No. 60/392,387, entitled CHARGE PUMP SYSTEM AND CLOCK GENERATOR, filed Jun. 29, 2002; and U.S. Provisional Application No. 60/395,534, entitled CHARGE PUMP SYSTEM AND CLOCK GENERATOR, filed Jul. 12, 2002, the entire contents of which are hereby incorporated by reference.

BACKGROUND OF THE INVENTION

1. Field of the Invention

The present invention relates generally to memory devices and, more particularly, to charge pump circuits for use an electrically reprogrammable non-volatile semiconductor memory devices.

2. Description of Related Art

A typical electrically reprogrammable non-volatile semiconductor memory device is a electrically erasable programmable read-only memory (EEPROM). U.S. Pat. No. 5,394,372, the entire contents of which are incorporated herein by reference to the extent compatible with the present invention, discloses a charge-pump system for use with such a memory, wherein the frequency is attenuated with increases in VDD. In this circuit architecture, however, the frequency is also reduced with increases in temperature. U.S. Pat. No. 6,064,275, the contents of which are incorporated herein by reference to the extent compatible with the present invention, discloses MOSFET having resistances that increases with temperature increases so that current produced by the circuit's current mirror is not optimally controlled.

SUMMARY OF THE INVENTION

In accordance with the present invention, a current mirror of a clock generator increases the reference current with increases in temperature, so that the charging time of the capacitors is increased to thereby increase a frequency of the clock generator with increases in temperature. Accordingly, the clock generator of the present invention, which is preferably used in combination with a charge pump, decreases in frequency with increases in VDD and increases in frequency with increases in temperature.

In accordance with another aspect of the present invention, the resistance is constant so that the current produced by the current mirror can be controlled. The resistance can be independent of temperature.

In one implementation, the current produced by the current mirror is controlled by a temperature dependent, current-adjusting MOSFET which has a threshold voltage (Vt) that varies with temperature. As the temperature varies, the current through the a temperature dependent, current-adjusting MOSFET varies. The MOSFET can be provided with a temperature-independent power supply, so that the current of the temperature dependent, current-adjusting MOSFET can be more closely controlled.

The various embodiments of the present invention may include or address one or more of the following objectives. One objective is to provide a clock generator whose frequency reduces as VDD increases and increases as the temperature increases. Using the clock generator in connection with a charge pump system can stabilize pump current and improve differential of Vclamp between high VDD and low VDD. Use of the charge pump system on a flash memory can improve the programming performance in low VDD and high temperature. Moreover, the charge pump system can reduce power consumption when programming in high VDD.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCIRPTION OF THE FIGURES

FIG. 2(*a*) is a concept diagram of another clock generator of another embodiment;

FIG. 3 is a plot illustrating a frequency of a clock generator that attenuates as VDD increases;

FIG. 4 is a plot showing a differential of Vclamp between high VCC and low VCC in a charge pump system;

FIG. 5(*b*) is the frequency generated by the clock generator as high VDD;

Figure 12:
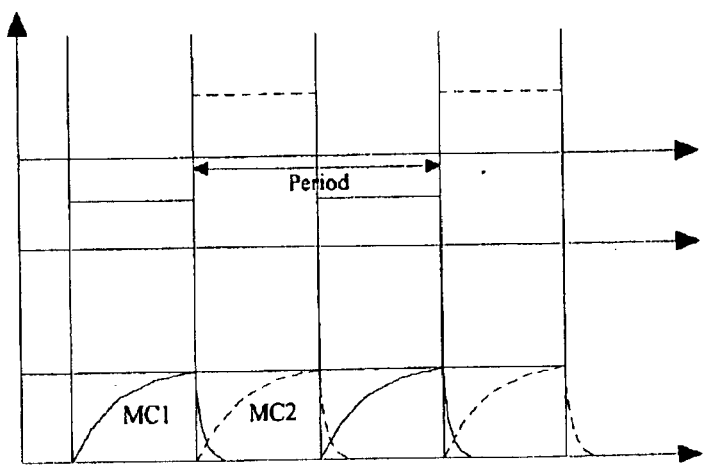
Figure 12:
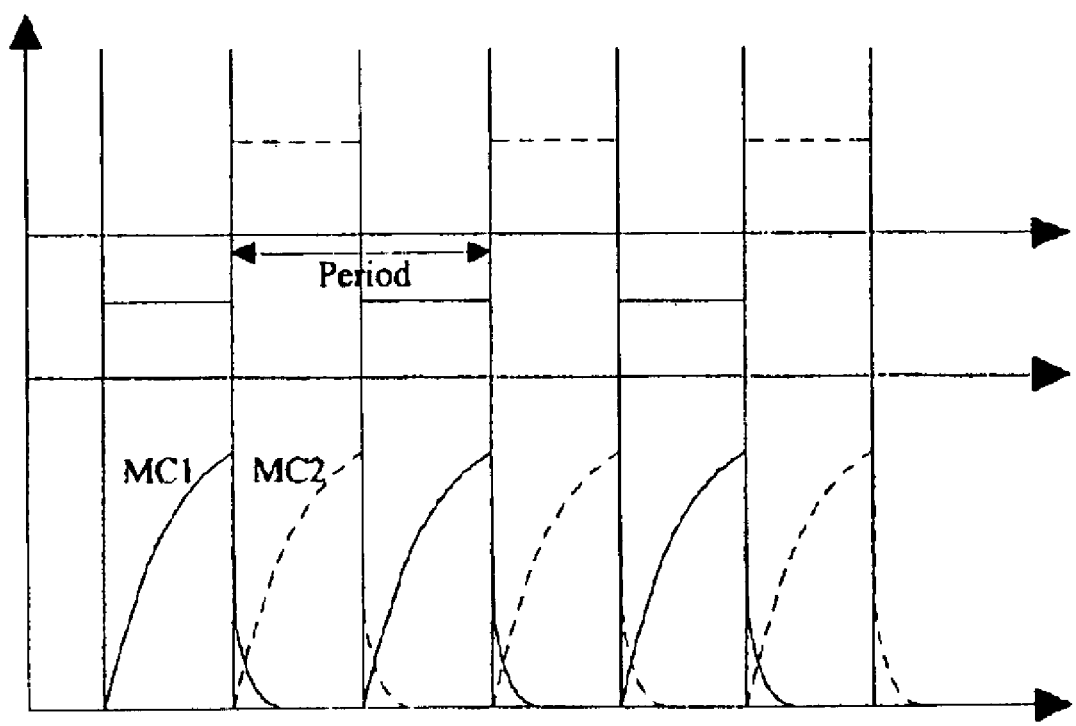

FIG. 12*a* is a frequency generated by a conventional clock generator in low VDD; and FIG. 12*b* is a frequency generated by a conventional clock generator in high VDD.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims.

It is to be understood and appreciated that the process steps and structures described herein do not cover a complete process flow for the manufacture of via structures. The present invention may be practiced in conjunction with various integrated circuit fabrication techniques that are conventionally used in the art, and only so much of the commonly practiced process steps are included herein as are necessary to provide an understanding of the present invention.

Figure 1:
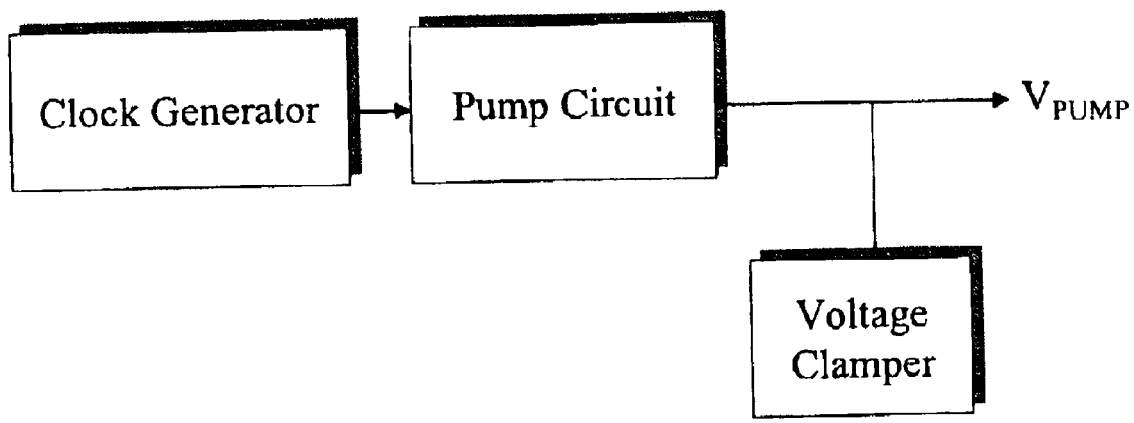
FIG. 1 is a block diagram of a charge pump system.

FIG. 1 is the block diagram of a charge pump system. A pump circuit receives a signal generated by a clock generator to generate a pump current and a pump voltage. Using a voltage clamper to control pump voltage values.

Figure 2:
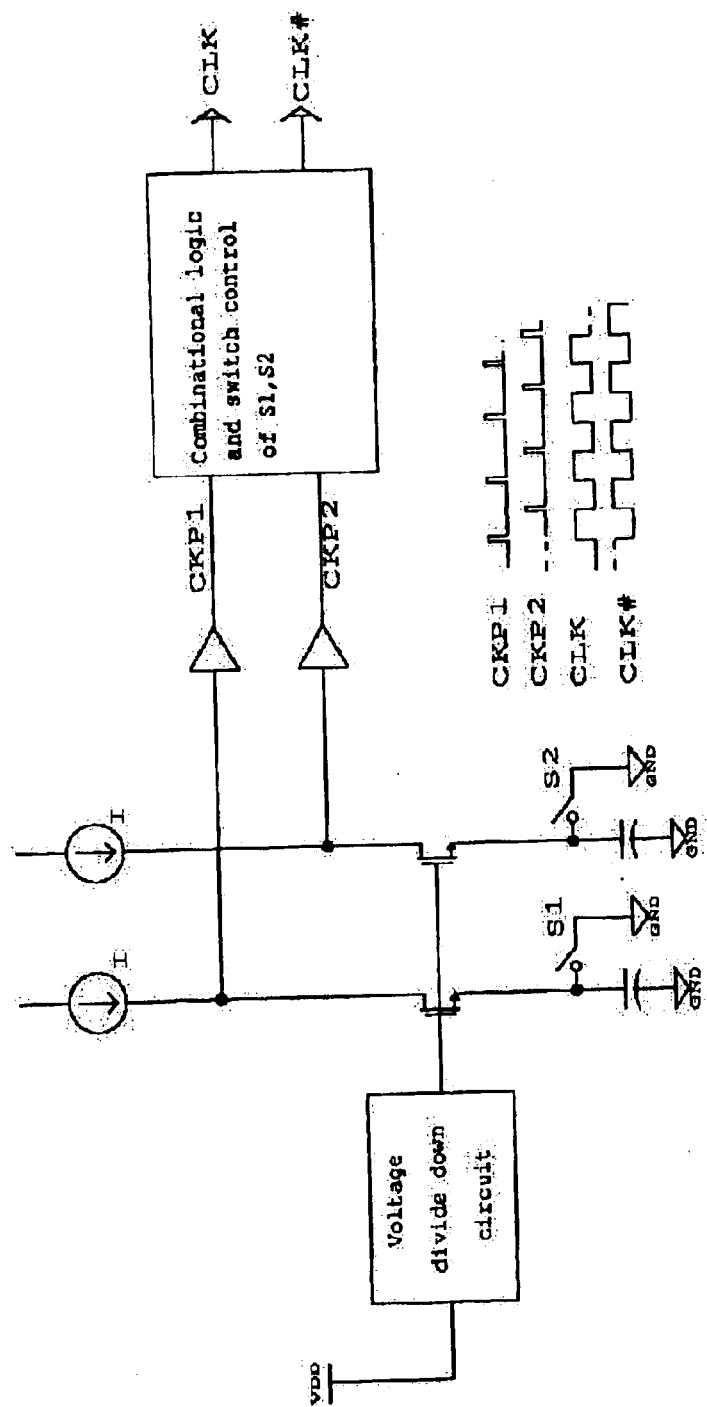
FIG. 2 is a concept diagram of a two phase clock generator.
Figure 2A:
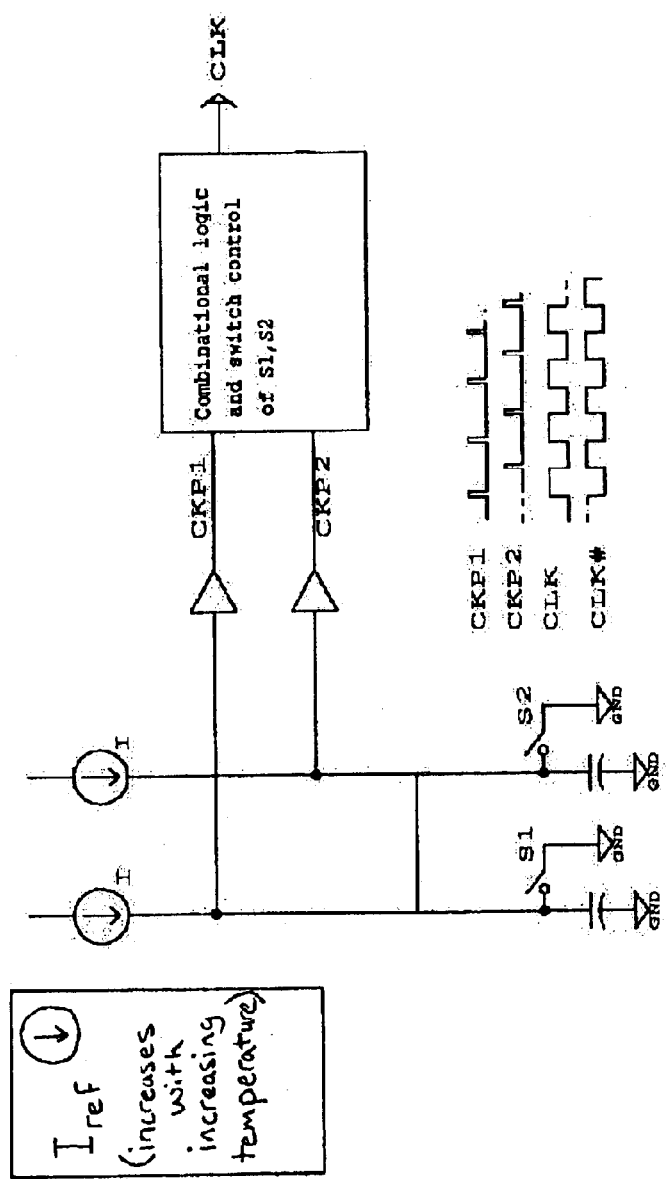

FIG. 2 is the concept diagram of a two phase clock generator of the present invention. FIG. 2a is another concept diagram of another clock generator of another embodiment of the present invention. The clock generator of the present invention has a frequency that attenuates as VDD increases is shown in FIG. 3. The clock generator can improve a differential of Vclamp between high VDD and low VDD, as shown in FIG. 4.

Figure 5:
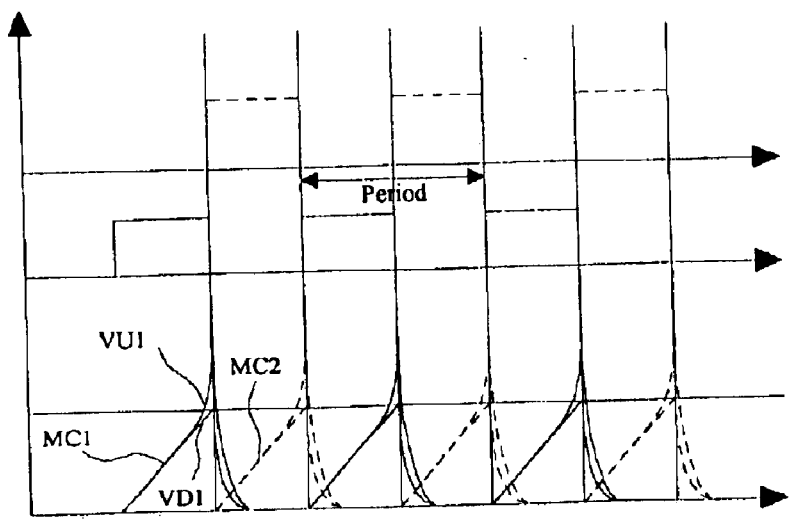
FIG. 5(*a*) shows a frequency generated by a clock generator as low VDD.
Figure 5:
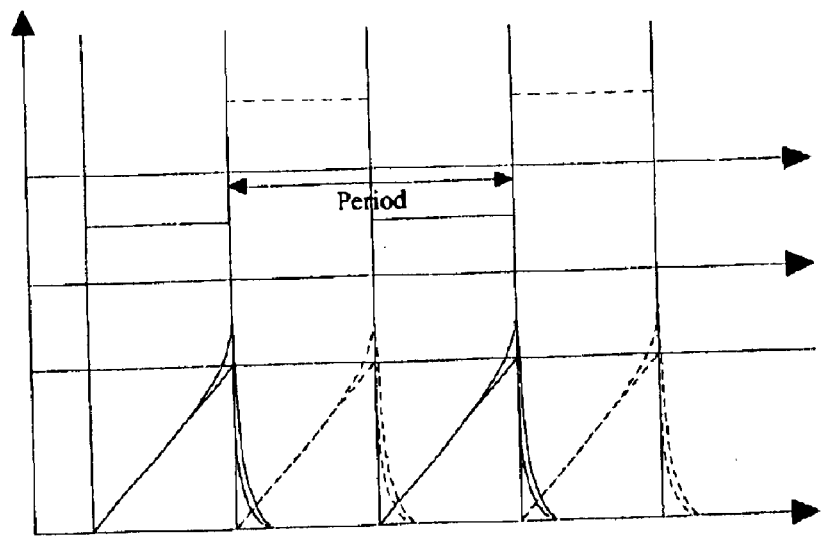

FIG. 5(a) is the frequency generated by the clock generator as low VDD, wherein the solid line is capacitor MC1 and the dashed line is capacitor MC2. FIG. 5(b) is the frequency generated by the clock generator with high VDD, wherein the solid line is capacitor MC1 and the dashed line is capacitors MC2. The frequency is attenuated with increases in high VDD. When VD1 achieves REFV1, MC1 is turned off and MC2 is turn on.

Figure 6:
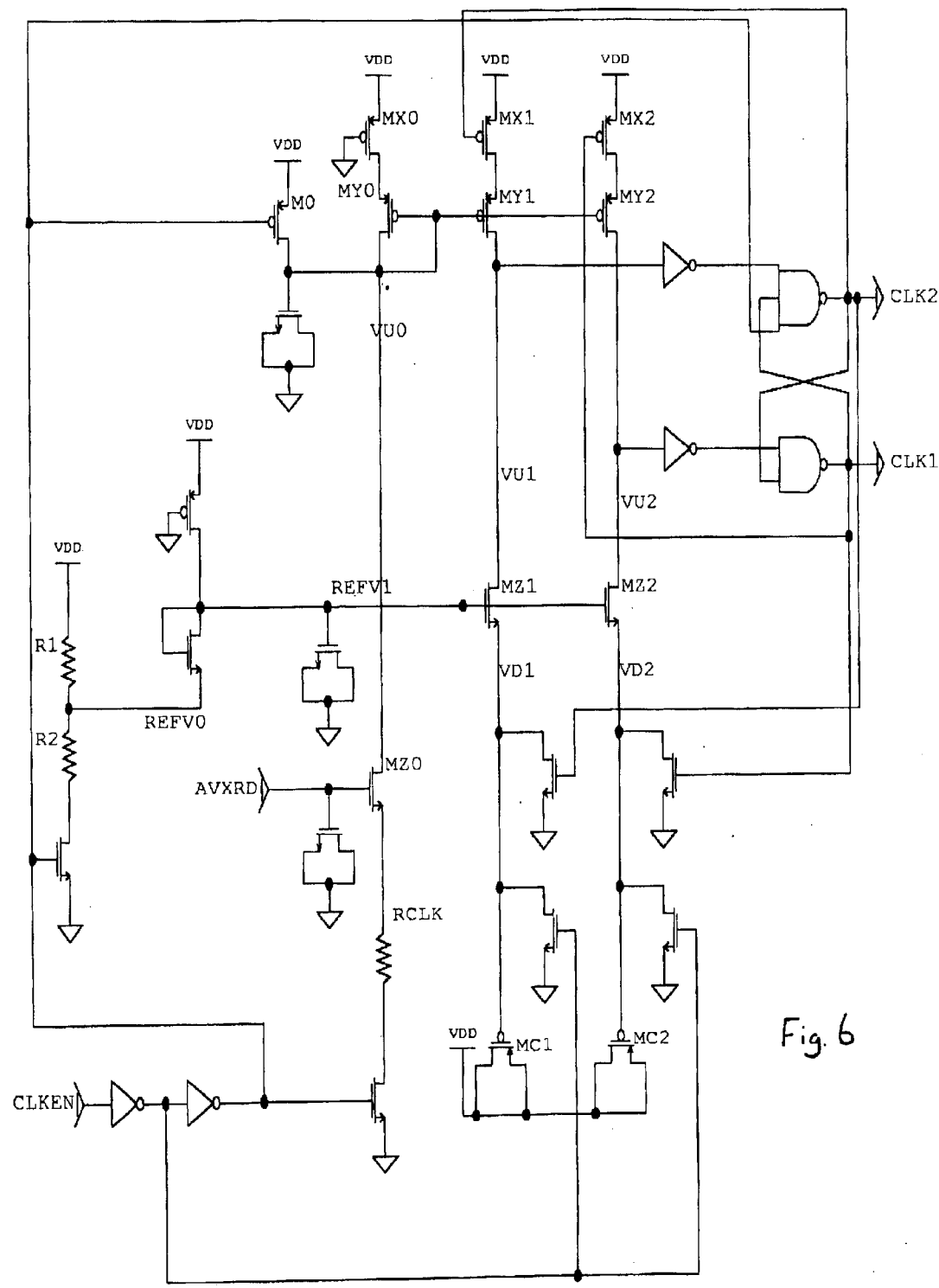
FIG. 6 is a specific embodiment of a clock generator.

FIG. 6 is an embodiment circuit of a clock generator of the present invention as shown in FIG. 2 and/or FIG. 2a. A second phase output, in addition to CLK, can be added. In accordance with one aspect, the clock generator of FIG. 6 can be interpreted to comprise a resistor (e.g., RCLK); a MOSFET (e.g., MZ0) having a gate, a drain and a source, the MOSFET being connected to the resistor for generating a reference current (e.g., through MV0); a first reference voltage (e.g., AVXRD) independent on VDD and temperature for controlling the MOSFET; a current mirror circuit (e.g., including MV0, MV1 and MV2) for generating a first (e.g., through MV1) and a second (e.g., throughMV2) mirror current by mirroring the reference current; a first capacitor (e.g., MC1) receiving said first mirror current and generating a first charged voltage (e.g., VD1); a second capacitor (e.g., MC2) receiving said second mirror current and generating a second charged voltage (e.g., VD2); and a logic circuit (e.g., including the pair of NAND gates) receiving said first and second charged voltages and generating a clock signal CLK. In accordance with another aspect of the invention, the circuit can further comprise a second reference voltage (e.g., REFV1) generated from an input supply voltage (e.g., VDD) for controlling the first and second charged voltages.

When VDD increases, the charging intervals of capacitors MC1 and MC2 increase and the frequency will be attenuated. When the temperature increases, Vt of the temperature dependent, current-adjusting MOSFET MZ0 will go down, so that the voltage across RCLK is higher and accordingly the current flow through MY0, MY1 and MY2 increases, and the frequency correspondingly increases. Thus, in accordance with an aspect of the present invention, the reference current is engineered to increase with temperature, so that the capacitors MC1 and MC2 charge more rapidly with increases in temperature.

To select the proper MZ0, the actual changes in frequency (e.g., drops in frequency) with temperature of a given clock generator circuit can first be determined, for example, using theoretical and empirical data. Next, the desired changes (e.g., increases) in frequency for each temperature rise can be determined. These determinations can be made for various operating parameters, such as for a range of different VDD values, etc. For example, for each given VDD (in a range of, for example, VDDlow to VDDhigh), a group of desired frequencies (or changes in frequency, e.g., increases in frequency) can be determined for a range of temperatures. The data may also vary in accordance with different charge pumps and/or Vclamp being implemented. This data can be tabulated and/or plotted, for example. In accordance with one aspect of the invention, any parameter can then be designed/implemented to control (e.g., change and preferably increase) the charging current to MC1 and MC2 to thereby generate changes (e.g., increases) in the current to MC1 and MC2 so that the desired frequency is obtained with each temperature change.

Various types of control devices/components/arrangements may be implemented to achieve the frequency-control function. The general configuration of such a device is shown in FIG. 2a as a block labeled "Iref (increases with increasing temperature)." It is to be understood, however, that other devices may be constructed besides or in addition to a current mirroring circuit wherein the reference current changes (or is controlled) with temperature changes. Moreover, in the illustrated or in other embodiments, the reference current may in some instances not change with temperature or actually decrease at certain temperatures values in a range of temperatures.

In the illustrated embodiment of FIG. 6, MZ0 is selected to have a threshold voltage (Vt) that decreases with increases in temperature, so that the desired reference currents can be generated with the increases in temperature. In a preferred embodiment, a voltage AVXRD that is independent of VDD and temperature is used to provide more consistent and predictable results. In other embodiments, the voltage AVXRD may be omitted.

Figure 7:
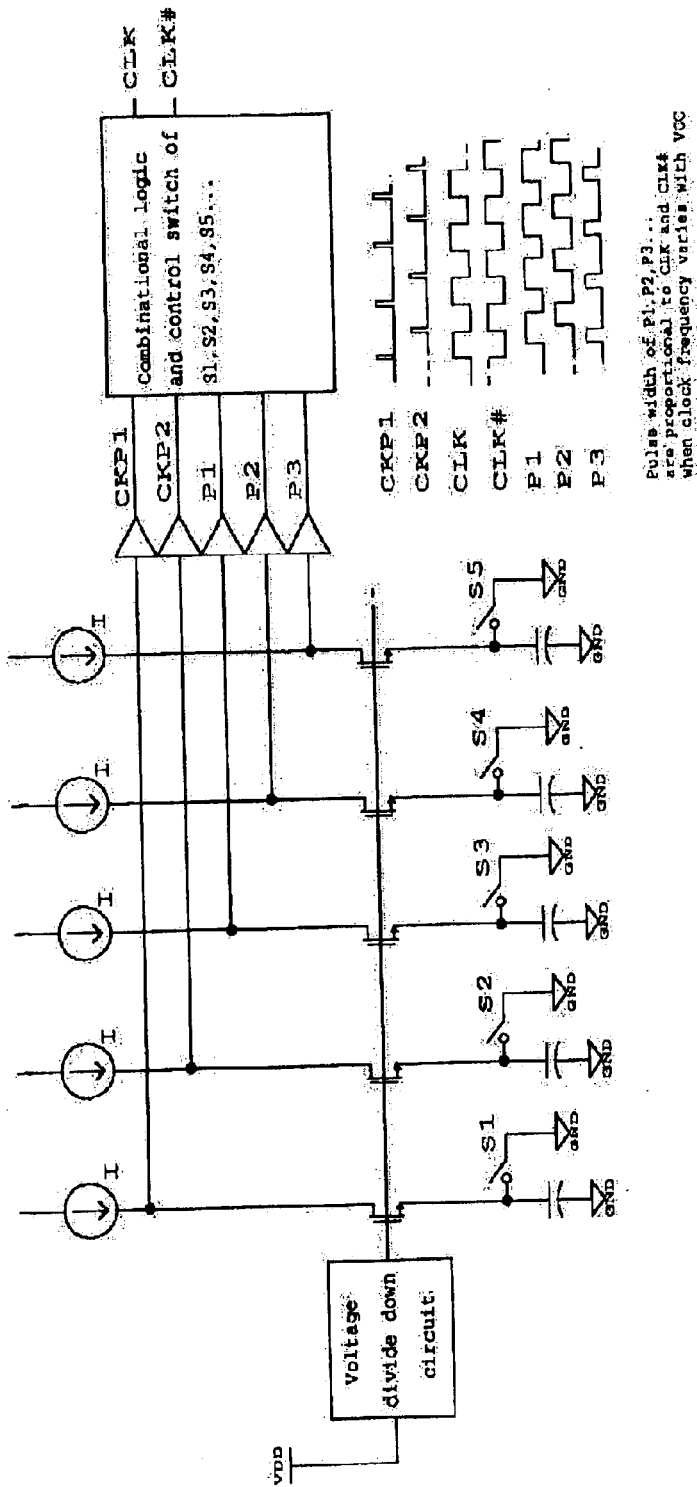
FIG. 7 is a concept diagram of a multiple phase clock generator.
Figure 8:
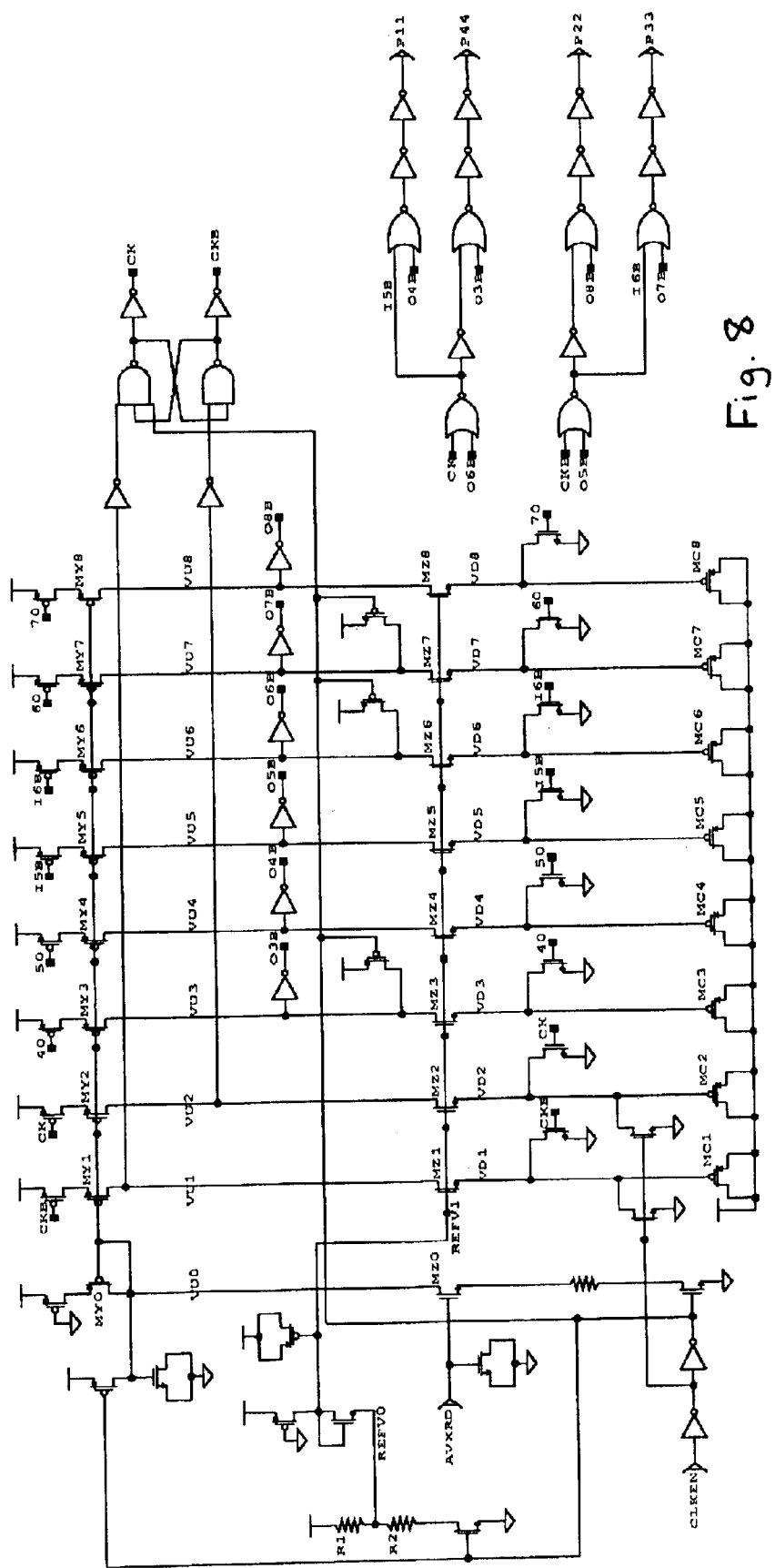
FIG. 8 is an implementation of a multiple phase clock generator.

FIG. 7 is the concept diagram of multiple phase clock generator of the present invention, and FIG. 8 is the embodiment circuit of multiple phase clock generator as shown in FIG. 7.

Figure 9:
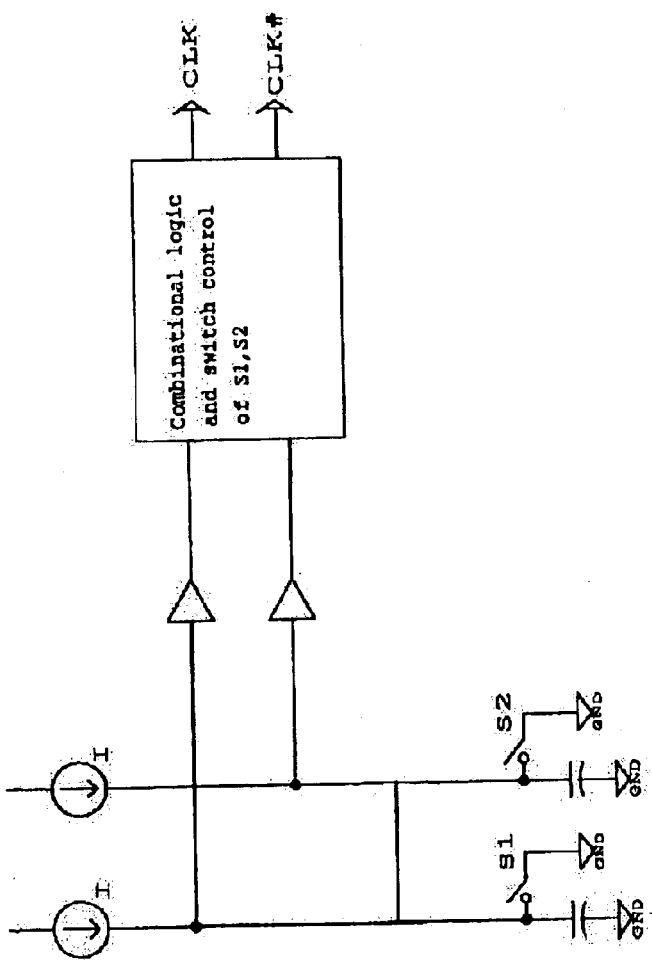
FIG. 9 is a conventional clock generator.
Figure 10:
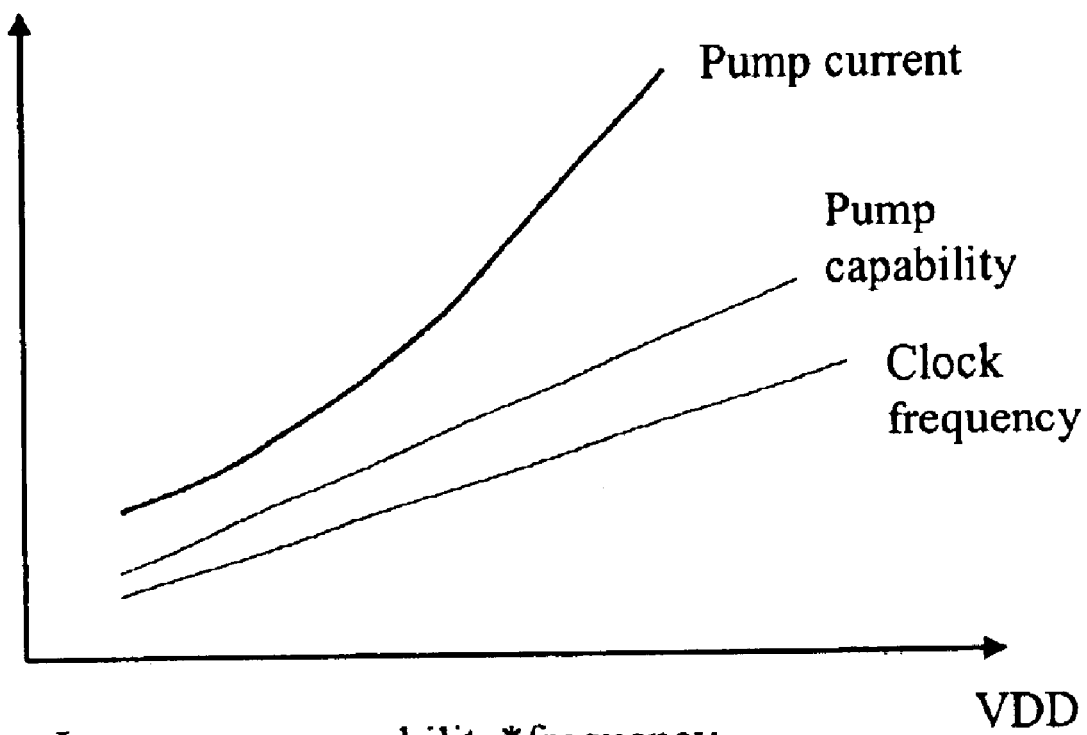
FIG. 10 is a plot of frequency of a conventional clock generator and the pump capability and pump current of a charge pump system using a conventional clock generator.
Figure 11:
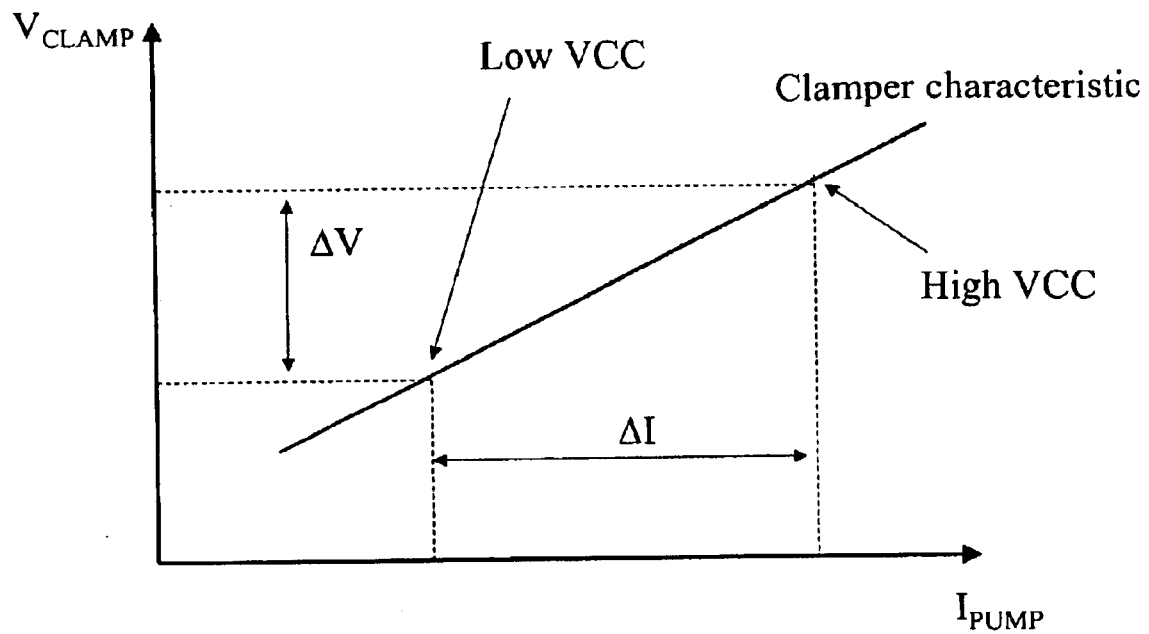
FIG. 11 is a plot showing a differential of Vclamp between high VDD and low VDD in a charge pump system using a conventional clock generator.

FIG. 9 is the conventional clock generator. The frequency of a conventional clock generator and the pump capability and pump current of a charge pump system using the conventional clock generator are show in FIG. 10. As shown in FIG. 11, the differential of Vclamp between high VDD and low VDD in a charge pump system using a conventional clock generator is relatively large. FIG. 12(a) is the frequency generated by a conventional clock generator in low VDD, and FIG. 12(b) is the frequency generated by the conventional clock generator in high VDD. The frequency increases when VDD increases.

In view of the foregoing, it will be understood by those skilled in the art that the methods of the present invention can facilitate formation of read only memory devices, and in particular read only memory devices exhibiting dual bit cell structures, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A clock generator comprising:

a resistor;

a MOSFET having a gate, a drain and a source connected to said resistor for generating a reference current;

a first reference voltage independent on VDD and temperature for controlling said MOSFET;

a current mirror circuit for generating a first and a second mirror current by mirroring said reference current;

a first capacitor receiving said first mirror current and generating a first charged voltage;

a second capacitor receiving said second mirror current and generating a second charged voltage;

a second reference voltage generated from an input supply voltage for controlling said first and second charged voltage; and a logic circuit receiving said first and second charged voltage and generating a clock signal.

2. The clock generator as set forth in claim 1, wherein said first capacitor, second capacitor and resistor determine the period of said clock signal.

3. A clock generator comprising:

a current mirror circuit for generating a first and a second mirror current by mirroring a reference current, which increases with temperature; and a first capacitor receiving the first mirror current and generating a first charged voltage;

a second capacitor receiving the second mirror current and generating a second charged voltage; and a logic circuit receiving the first and second charged voltages and generating a clock signal.

4. The clock generator as set forth in claim 3, and further comprising;

a resistor; and a MOSFET having a gate, a drain and a source, the MOSFET being connected to the resistor for generating the reference current.

5. The clock generator as set forth in claim 4, wherein the MOSFET has a threshold voltage (Vt) that decreases with increasing temperature.

6. The clock generator as set forth in claim 5, wherein the threshold voltage (Vt) decreases with increasing temperature so that a current through the MOSFET increases with increasing temperature.

7. The clock generator as set forth in claim 6, wherein the threshold voltage (Vt) decreases with increasing temperature so that a frequency of the clock signal increases with increasing temperature.

8. The clock generator as set forth in claim 4, wherein the first capacitor, second capacitor and resistor determine the period of the clock signal.

9. The clock generator as set forth in claim 4, and further comprising a first reference voltage independent on VDD and temperature for controlling the MOSFET.

10. The clock generator as set forth in claim 7, and further comprising a second reference voltage generated from an input supply voltage for controlling the first and second charged voltage.

11. A method of generating a clock signal in a charge pump, comprising:

mirroring a reference current, which increases with temperature, to generate a first and a second mirror current;

receiving the first mirror current and generating a first charged voltage with a first capacitor;

receiving the second mirror current and generating a second charged voltage with a second capacitor; and receiving the first and second charged voltages into a logic circuit and generating a clock signal.

12. The method as set forth in claim 11, wherein the mirroring of a reference current is preceded by generating the reference current using a MOSFET connected to a resistor, wherein a threshold voltage (Vt) of the MOSFET decreases with increasing temperature.

13. The method as set forth in claim 12, wherein the threshold voltage (Vt) decreases with increasing temperature so that a current through the MOSFET increases with increasing temperature.

14. The method as set forth in claim 13, wherein the threshold voltage (Vt) decreases with increasing temperature so that a frequency of the clock signal increases with increasing temperature.

15. The method as set forth in claim 12, and further comprising controlling the MOSFET with a first reference voltage independent of a supply voltage VDD and temperature.

* * * * *